United States Patent [19]
Jang et al.

[11] Patent Number: 5,840,624
[45] Date of Patent: Nov. 24, 1998

[54] REDUCTION OF VIA OVER ETCHING FOR BORDERLESS CONTACTS

[75] Inventors: Syun-Ming Jang; Yu Chen-Hua Douglas, both of Hsin-chu, Taiwan

[73] Assignee: Taiwan Semiconductor Manufacturing Company, Ltd, Hsin-chu, Taiwan

[21] Appl. No.: 616,411

[22] Filed: Mar. 15, 1996

[51] Int. Cl.$^6$ ................. H01L 21/4763; H01L 21/44
[52] U.S. Cl. ................. 438/624; 438/625; 438/653; 438/761; 438/791
[58] Field of Search ................. 437/195, 194, 437/196, 197, 198, 199, 40 R, 41 R, 41 SM, 241; 438/622, 624, 625, 652, 761, 791, 653

[56] References Cited

U.S. PATENT DOCUMENTS

| | | |
|---|---|---|
| 4,732,801 | 3/1988 | Joshi ................. 437/241 |
| 4,966,870 | 10/1990 | Barber et al. ................. 437/241 |
| 5,164,334 | 11/1992 | Mizushima ................. 437/195 |
| 5,350,712 | 9/1994 | Shibata ................. 437/195 |
| 5,393,703 | 2/1995 | Olowolafe et al. ................. 437/194 |
| 5,451,543 | 9/1995 | Woo et al. ................. 437/190 |
| 5,561,084 | 10/1996 | Takata ................. 437/195 |
| 5,571,751 | 11/1996 | Chung ................. 437/195 |
| 5,587,338 | 12/1996 | Tseng ................. 437/200 |
| 5,599,740 | 2/1997 | Jang et al. ................. 437/238 |
| 5,612,254 | 3/1997 | Mu et al. ................. 437/195 |

*Primary Examiner*—Michael Trinh
*Attorney, Agent, or Firm*—George O. Saile; Stephen B. Ackerman

[57] ABSTRACT

A method for forming a borderless, contact or via hole, has been developed, in which a thin silicon nitride layer is used as an etch stop to prevent attack of an underlying interlevel dielectric layer, during the opening of the borderless, contact or via hole, in an overlying, interlevel dielectric layer. The thin silicon nitride layer is the top layer of an interlevel dielectric composite layer, used between metal interconnect levels.

9 Claims, 6 Drawing Sheets

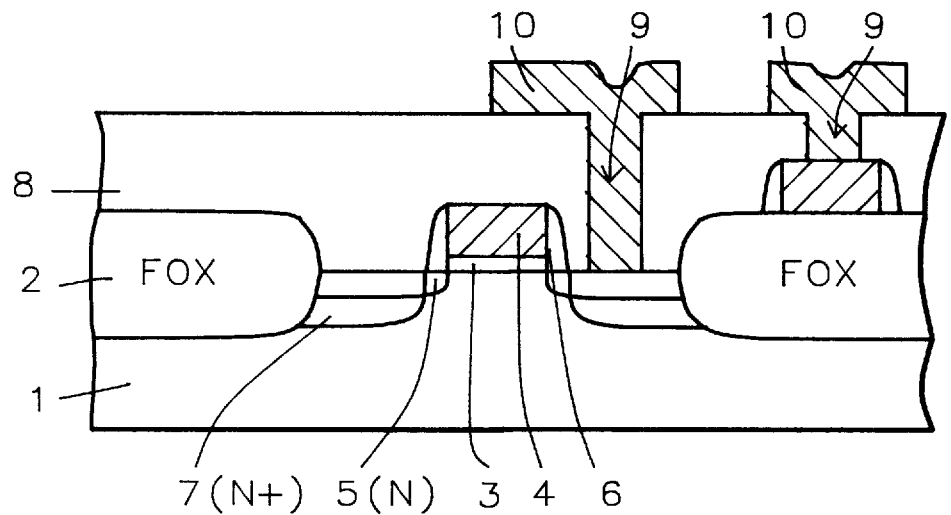
FIG. 1
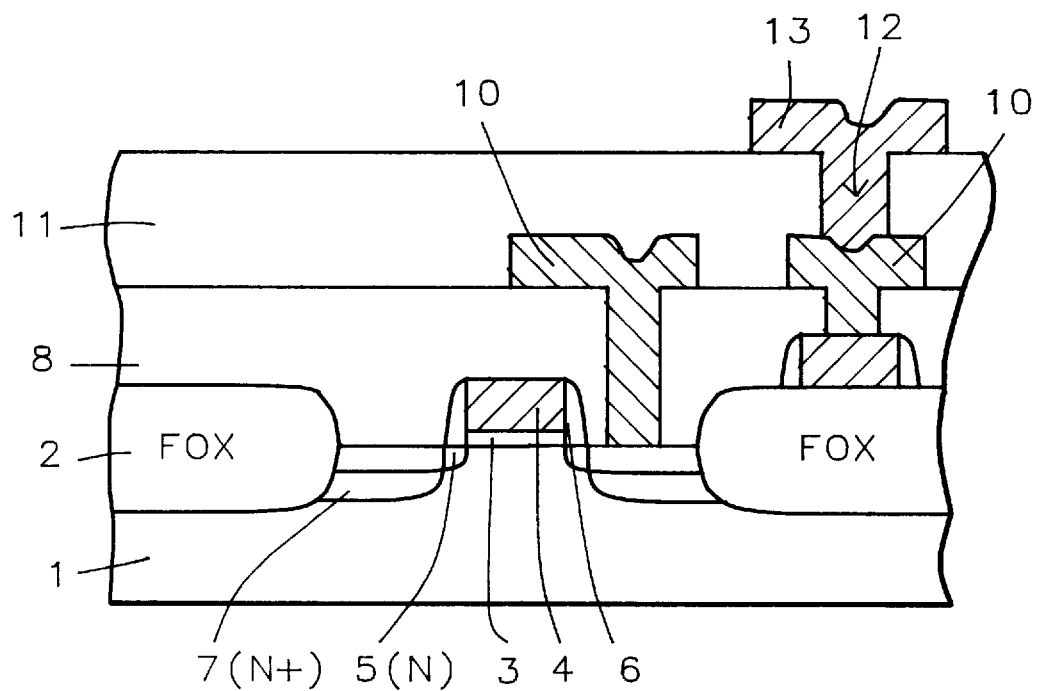
FIG. 2 — Prior Art

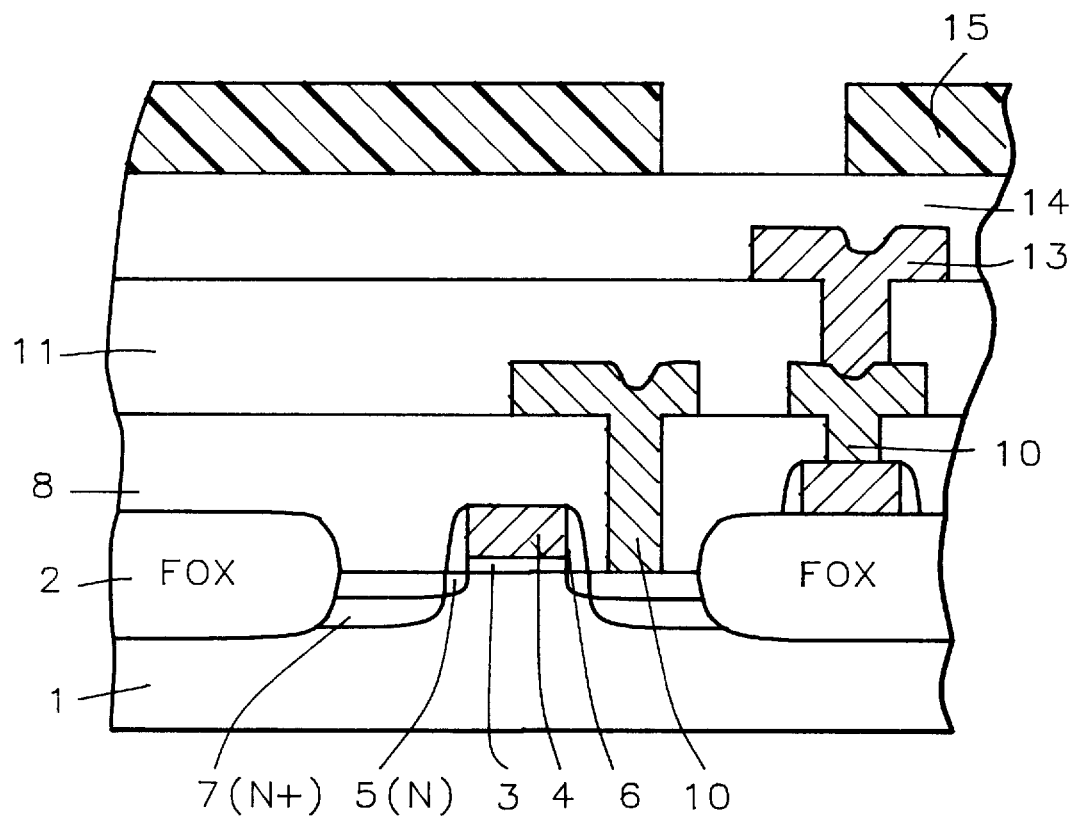
FIG. 3 – Prior Art

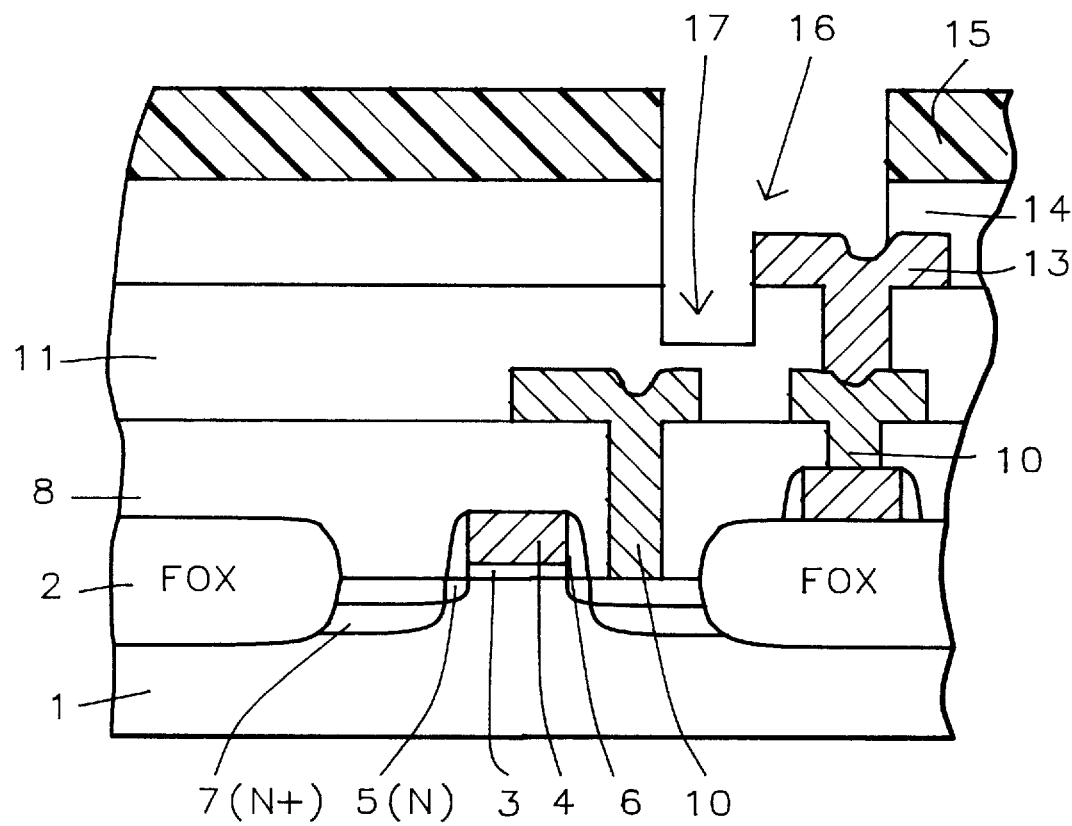
FIG. 4 – Prior Art 5,840,624

REDUCTION OF VIA OVER ETCHING FOR BORDERLESS CONTACTS

BACKGROUND OF THE INVENTION

1. Field of the Invention

The present invention relates to methods used to fabricate semiconductor devices, and more specifically to a process used to form via holes.

2. Description of Prior Art

The major objectives of the semiconductor industry has been to continually increase the device and circuit performance of silicon chips, while maintaining, or even decreasing, the cost of producing these same silicon chips. These objectives have been successfully addressed by the ability of the semiconductor industry to fabricate silicon devices, with sub-micron features. The ability to use sub-micron features, or micro-miniaturazation, has allowed performance improvements to be realized by the reduction of resistances and parasitic capacitances, resulting from the use of smaller features. In addition, the use of sub-micron features, results in smaller silicon chips with increased circuit densities, thus allowing more silicon chips to be obtained from a starting silicon substrate, thus reducing the cost of an individual silicon chip.

The attainment of micro-miniaturazation has been basically a result of advances in specific semiconductor fabrication disciplines, such as photolithography and reactive ion etching. The development of more sophisticated exposure cameras, as well as the use of more sensitive photoresist materials, have allowed sub-micron features in photoresist layers to be routinely achieved. In addition similar developments in the dry etching discipline, has allowed these sub-micron images in photoresist layers, to be successfully transferred to underlying materials, used for the creation advanced semiconductor devices. However the use of sub-micron features, although improving silicon device performance and decreasing silicon chip cost, introduces specific semiconductor fabrication problems, not encountered with larger featured counterparts. For example, specific designs sometimes require that metal filled via holes, in insulator layers, used to connect an overlying metallization structure to an underlying metallization structure, not always be fully landed. That is the metal filled via, not being placed entirely on the underlying metallization structure. The inability to fully land a via on an underlying metal structure, places a burden on the process used to create the via hole. For example if the chip design demands a non-fully landed, or a borderless contact, the dry etching procedure, used to create the via, has to be able to insure complete removal of insulator material from the area where the via landed on the underlying metal structure, therefore necessitating the use of an overetch cycle. The overetch cycle however, can create problems in the area where the via missed the underlying metal structure, and resided partially on an underlying insulator layer. The underlying insulator layer, may be identical, or similar, to the insulator used for the via formation. The extent of the via hole overetch cycle can then result in severe etching of the underlying insulator layer, to a point where a lower level metallization structure may be exposed. Subsequent metal filling of the via hole can then result in interlevel leakages or shorts. In addition the above phenomena can even occur, due to photolithographic misalignment situations, with fully landed contacts.

Shibata, et al, in U.S. Pat. No. 5,350,712 describe a process for alleviating the consequences of the via hole misalignment, or borderless contact phenomena. However this present invention will describe a different approach to the misalignment or borderless contact, via hole phenomena. An approach which offers protection from misalignment problems, with little added cost or complexity.

SUMMARY OF THE INVENTION

It is an object of this invention to fabricate silicon devices using metal filled via holes that are not always fully landed, on underlying metal structures, as a result of a borderless contact design, or as a result of misalignment.

It is another object of this invention to open a borderless contact, or misaligned via hole, in an overlying interlevel dielectric layer, to an underlying metal structure, while exposing a composite underlying interlevel dielectric layer in the area of misalignment, or in the area of borderless deign, at end point.

It is still another object of this invention to use a composite underlying interlevel dielectric layer consisting of a top layer of insulator, that has a slower etch rate than the overlying interlevel dielectric layer.

It is still yet another object of this invention to open the borderless, or misaligned via, in the overlying interlevel dielectric layer, using a dry etching procedure, and being able to perform an overetch cycle to insure complete removal of the overlying interlevel dielectric layer, while not removing the top layer of the underlying, composite interlevel dielectric layer, in an area of misalignment, or borderless design.

In accordance with the present invention a process is described for fabricating silicon devices using a borderless contact, or via process, in which an etch stop layer is provided to protect underlying structures from attack during the borderless contact, dry etching process. A first, interlevel dielectric composite layer, comprised of a overlying thin, silicon nitride layer, and an underlying thick, silicon oxide layer, is deposited on an underlying metal structure, used to electrically contact an underlying active device region. A first via hole is opened in the first interlevel dielectric composite layer, followed by deposition of a metallization layer, and patterning to form a metal structure. A second interlevel dielectric layer of silicon oxide is deposited on the underlying metal structure, as well as on the thin silicon nitride layer, of the first interlevel dielectric composite layer. A second via hole is opened, via selective, dry etching procedures, in the second interlevel dielectric layer, exposing the top surface of the metal structure, and the surface of the thin silicon nitride layer, in regions where the borderless, or misaligned via hole did not overlay the metal structure. A selective dry overetch procedure, used to insure complete removal of the second interlevel dielectric layer, from the surface of the metal structure, is performed without removing the thin silicon nitride layer. The second via hole is then filled with a metal, and patterned to form another overlying metal structure.

BRIEF DESCRIPTION OF THE DRAWINGS

The object and other advantages of this invention are best described in the preferred embodiment with reference to the attached drawings that include:

FIG. 1, which schematically, in cross-sectional style, shows an N channel MOSFET device, through contact level metal patterning.

FIGS. 2–4, which schematically, in cross-sectional style, show prior art, and attempts at opening borderless contacts, or misaligned vias, to a first level metal structure, exposing an underlying contact level metal structure, in the region of via hole misalignment.

DESCRIPTION OF THE PREFERRED EMBODIMENTS

Figure 5:
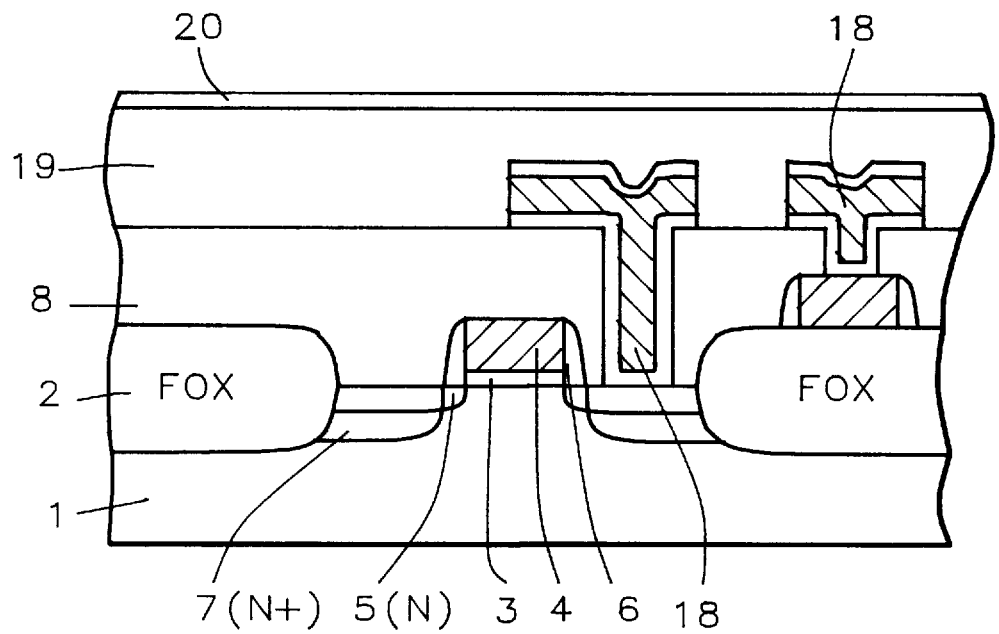
FIGS. 5–8, which schematically, in cross sectional style, show the stages of fabrication used to create metal filled vias, in which the vias were of a borderless design, or misaligned, but did not result in exposure of underlying metal structures, during the dry etching procedure, due to the incorporation of a thin silicon nitride etch stop layer.

The method of fabricating via holes, using a borderless contact design, in which an etch stop layer is provided to protect against over etching and exposure of underlying metal structures, during the opening of the borderless contact, or via hole, will now be covered in detail. This invention can be used as part of metal oxide semiconductor field effect transistors, (MOSFET), devices, that are now being manufactured in industry, therefore only the specific areas, unique to understanding this invention will be covered in detail. FIG. 1, schematically shows a typical N channel, (NFET), device, that this invention can be used with. A P type, substrate, 1, with a <100> crystallographic orientation, is used. Thick field oxide regions, 2, (FOX), are formed via conventional photolithographic and dry etching patterning of a composite insulator layer of silicon nitride and silicon dioxide, and then using the composite insulator layer as an oxidation mask, to thermally grow between about 4000 to 6000 Angstroms of FOX insulator, 2, in the unmasked regions. After removal of the composite insulator, oxidation mask, a silicon oxide layer, 3, is thermally grown to a thickness between about 50 to 300 Angstroms, and used as the gate insulator of the MOSFET device. A polysilicon layer is next deposited, using low pressure chemical vapor deposition, (LPCVD), procedures, to a thickness between about 2000 to 4000 Angstroms, and doped via ion implantation of arsenic or phosphorous, at an energy between 50 to 100 Kev., at a dose between about 1E15 to 1E16 atoms/cm$^2$. The polysilicon layer is then patterned using conventional photolithographic and reactive ion etching, (RIE), processing, to create polysilicon gate structure, 4, shown schematically in FIG. 4.

A lightly doped source and drain region, 5, is then formed via ion implantation of phosphorous at an energy between about 30 to 60 Kev., at a dose between about 1E12 to 5E13 atoms/cm$^2$. A layer of silicon oxide is deposited using either LPCVD or plasma enhanced chemical vapor deposition, (PECVD), processing, to a thickness between about 1500 to 4000 Angstroms, and subjected to an anisotropic RIE procedure, in CHF$_3$, to create insulator spacer, 6, shown in FIG. 1. A heavily doped source and drain region, 7, is then formed, via ion implantation of arsenic at an energy between about 50 to 100 Kev., at a dose between about 1E14 to 5E15 atoms/cm$^2$. Another silicon oxide layer, 8, is deposited using LPCVD or PECVD processing, at a temperature between about 400° to 800° C., to a thickness between about 3000 to 6000 Angstroms, followed by a photolithographic and RIE procedure, using CHF$_3$ as an etchant, and used to create contact hole, 9. After photoresist removal, using plasma oxygen ashing, followed by careful wet cleans, a metallization layer of aluminum, containing between about 1 to 3% copper, and between about 0.5 to 1% silicon, is deposited via r.f. sputtering, to a thickness between about 4000 to 8000 Angstroms. The metallization layer can also be LPCVD tungsten, deposited via the decomposition of tungsten hexafluoride. Patterning of the metallization layer is performed by again using conventional photolithographic and RIE processing, using Cl$_2$ as an etchant, to create metal structure, 10, shown schematically in FIG. 1. Photoresist removal is accomplished via plasma oxygen ashing followed by careful wet cleans.

FIGS. 2–4, will show prior art, and attempts at creating borderless contacts, or misaligned vias, to underlying metal structures, resulting in severe over etching of underlying insulators, due to the non-selectivity of the materials and dry etchants used. A layer of PECVD, silicon oxide, 11, is deposited at a temperature between about 400° to 600° C., to a thickness between about 3000 to 6000 Angstroms. A first via hole, 12, is created in silicon oxide layer, 11, to metal structure, 10, using conventional photolithographic and RIE processing, using CHF$_3$ as an etchant. After photoresist removal, via plasma oxygen ashing and careful wet cleans, another metallization layer of aluminum, containing between about 1 to 3% copper, and between about 0.5 to 1% silicon is deposited using r.f. sputtering, to a thickness between about 4000 to 8000 Angstroms. This metallization layer can also be LPCVD tungsten, using a tungsten hexafluoride source, if desired. Patterning of the metallization layer, to form metal structure, 13, is accomplished again via conventional photolithographic and RIE procedures, using Cl$_2$ as an etchant. FIG. 2, schematically shows this structure after photoresist removal using plasma oxygen ashing and careful wet cleans.

An insulator layer of silicon oxide, 14, is deposited again using PECVD processing, at a temperature between about 400° to 600° C., to a thickness between about 3000 to 6000 Angstroms. The desired opening to metal structure, 13, is next addressed by opening a hole in photoresist layer, 15. The opening in photoresist layer can either be intentionally designed to be borderless, that is not open entirely on the top surface of metal structure, 13, or can suffer from misalignment problems, and again not open entirely over metal structure, 13. This is shown in FIG. 3. The dry etching procedure, used to open a second via, 16, in silicon oxide layer, 14, is next performed using CHF$_3$ as an etchant. At the conclusion of the RIE procedure, or when end point is determined by the observance of the top surface of metal structure, 13, an additional overetch cycle is used to insure complete removal of silicon oxide, 14, from the top surface of metal structure, 13, in areas where poor uniformity of the PECVD silicon oxide layer, 14, may have existed. The overetch cycle does not adversely effect metal structure, 13, since the etchant used to create second via, 16, will not attack the metal. However the overetch cycle can severely attack the underlying silicon oxide layer, 11, in regions where the second via did not overlie metal structure, 13. The overetch creates a gouge or crevice, 17, shown schematically in FIG. 4. The extent of this defect, when subsequently filled with an overlying metallization, can result in either deleterious leakage, or even shorts, between the overlying metallization and an underlying metal structure, used to electrically contact an active device region of the MOSFET structure, different then the active device region being addressed by a metal structure in second via, 16.

A solution to the crevicing or gouging phenomena, occurring as a consequence of borderless contacts, or misaligned via holes, is now addressed. FIG. 5, again shows the creation of a metal structure, contacting both a polysilicon gate structure, 4, and a source and drain region, 7, through an opened contact hole, in silicon oxide layer, 8. The metallization used is an underlying layer of titanium nitride, between about 200 to 500 Angstroms, a layer of aluminum, between about 4000 to 8000 Angstroms, containing between about 1 to 3% copper, and between about 0.5 to 1% silicon, and an overlying layer of titanium nitride, again between about 200 to 500 Angstroms. The titanium nitride layers offer, adhesive, barrier, and electromigration enhancements. The metallization layer is then patterned using conventional photolithographic and RIE procedures, using $Cl_2$ as an etchant to create metal structure, 18. Photoresist removal is performed using plasma oxygen ashing and careful wet cleans. A composite interlevel dielectric layer is then deposited, consisting of an underlying silicon oxide layer, 19, obtained via PECVD processing, at a temperature between about 400° to 600° C., to a thickness between about 3000 to 6000 Angstroms, and an overlying layer of silicon nitride, 20, obtained via PECVD processing, at a temperature between about 400° to 600° C., to a thickness between about 500 to 1000 Angstroms.

Figure 6:
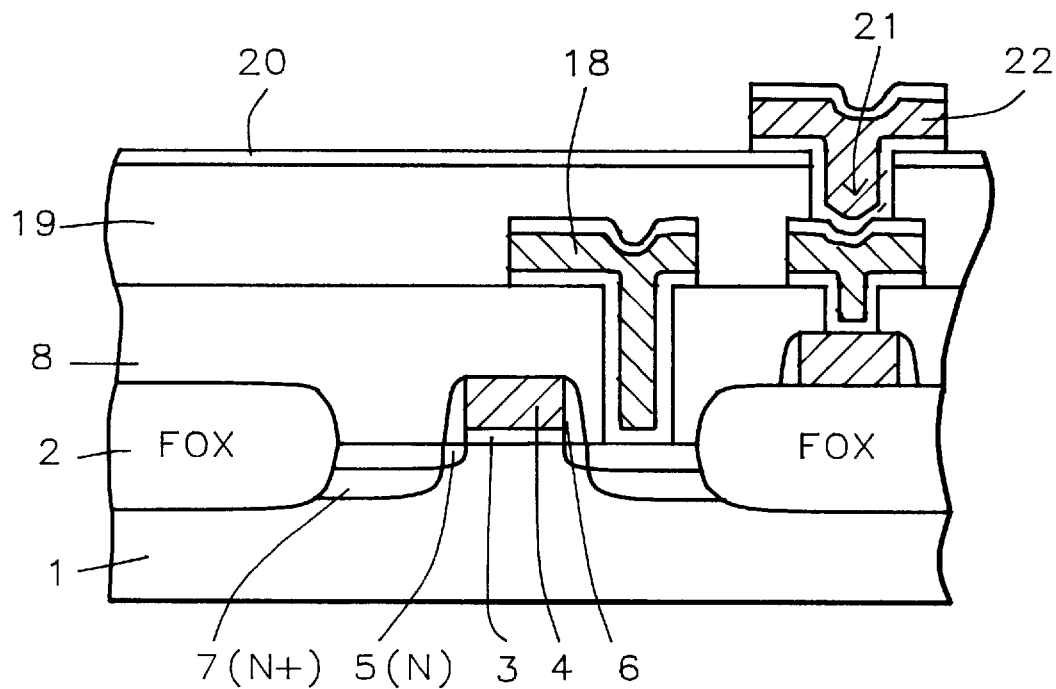

A first via hole, 21, is next opened in the composite interlevel dielectric layer, to expose metal structure, 18, which in turn is contacting an underlying polysilicon gate structure, 4, via use of conventional photolithographic and RIE procedures, using $Cl_2$ for silicon nitride layer, 20, and $CHF_3$, for silicon oxide layer, 19, as etchants. After removal of photoresist via plasma oxygen ashing and careful wet cleans, another layer of titanium nitride—aluminum, with copper and silicon,—titanium nitride, is deposited using process conditions, and film thicknesses, identical to those previously supplied for the metallization layer used to create metal structure, 18. Photolithographic and RIE procedures, again using $Cl_2$ as an etchant are used to define metal structure, 22, shown schematically in FIG. 6. Photoresist removal is again accomplished using plasma oxygen ashing and careful wet cleans.

Figure 7:
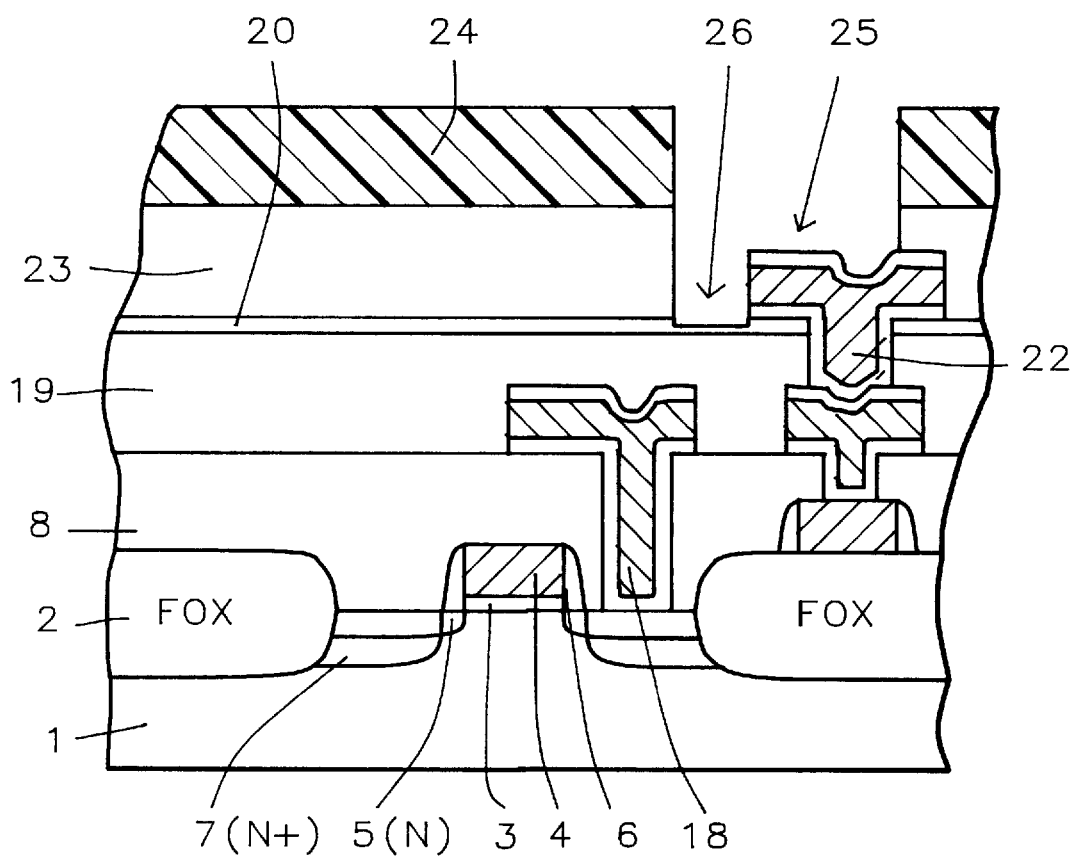

A silicon oxide layer, 23, is deposited using PECVD processing, at a temperature between about 400° to 600° C., to a thickness between about 3000 to 6000 angstroms. Photoresist layer, 24, is applied and exposed to open a region to be used for an intentional borderless contact. The opening may be also be misaligned, which will create an unintentional borderless contact. A RIE procedure is next used to open second via hole, 25, in is silicon oxide layer, 23. The chemistry of the etchant used, $CHF_3$ for silicon oxide layer, 23, and the RIE conditions are chosen to result in a selectivity of silicon oxide layer, 23, to underlying silicon nitride layer, 20, of between about 3 to 1, in the $CHF_3$ ambient. The enhanced selectivity between silicon oxide and the underlying silicon nitride layer, allows a robust overetch cycle to be performed to insure complete removal of thick regions of silicon oxide from the top surface of metal structure 22, without creating a severe gouge or crevice in the underlying composite interlevel dielectric layer, in regions where the second via, 25, did not overlie metal structure, 22. The minimum crevice or gouge, 26, is confined to the thin silicon nitride etch stop layer, 20. This is schematically shown in FIG. 7. Photoresist removal is performed using plasma oxygen ashing and careful wet cleans.

Figure 8:
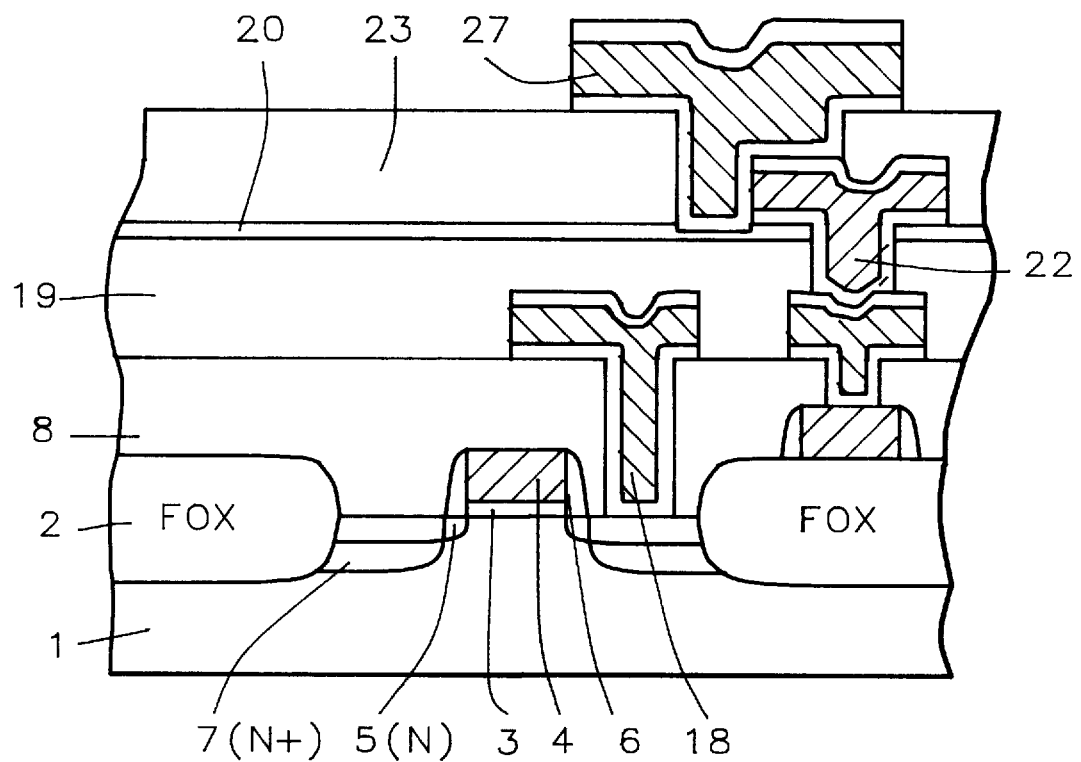

Another metallization is performed via r.f. sputtering, of overlying and underlying layers of titanium nitride, at a thickness between about 200 to 500 Angstroms, and a core layer of aluminum, containing between about 1 to 3% copper, and between about 0.5 to 1% silicon, at a thickness between about 4000 to 6000 Angstroms. Once again patterning of the metallization layer is accomplished via standard photolithographic and RIE procedures, using $Cl_2$ as an etchant, to create metal structure, 27. Photoresist removal is again performed using plasma oxygen ashing, followed by careful wet cleans. FIG. 8, schematically shows that silicon nitride etch stop layer, 20, preventing crevicing or gouging of silicon oxide layer, 19, and thus prevented leakage or shorts between metal structure, 27, connected to a polysilicon gate structure, and metal structure, 18, connected to a source and drain region, of a MOSFET device structure.

Although this process for creating borderless contacts, using a silicon nitride etch stop, to prevent metal leakages and shorts, has been shown for an N channel, (NFET) device, it can also be applied to P channel, (PFET), devices, complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device structure, on a semiconductor substrate, using an etch stop layer, as part of an underlying interlevel dielectric composite layer, to prevent the etching of said underlying said interlevel dielectric composite layer, during the creation of a via hole, in an overlying interlevel dielectric layer, comprising the steps of:

providing a MOSFET device structure, with source and drain regions on said semiconductor substrate;

providing metal filled contact holes, in a silicon oxide layer, contacting a source and drain region of said MOSFET device structure;

deposition of a first interlevel dielectric composite layer, consisting of a thick underlying first insulator layer, and of a thin overlying second insulator layer, on said metal filled contact hole, and on a top surface of said silicon oxide layer;

opening a first via hole in said first interlevel dielectric composite layer, to said metal filled contact hole;

depositing a first metallization layer on said first interlevel dielectric composite layer, completely filling said first via hole;

patterning of a top portion of said first metallization layer to form a first level metal structure;

deposition of a second interlevel dielectric layer on said first level metal structure, and on a top surface of said thin overlying insulator layer, of said first interlevel dielectric composite layer;

opening a second via hole in said second interlevel dielectric layer, to said first level metal structure, and to the top surface of said thin overlying insulator layer, of said first interlevel dielectric composite layer, in regions where said second via hole did not overlie said first level metal structure, exposing a portion of the top surface of said first level metal structure, and exposing a side of said first level metal structure;

deposition of a second metallization layer on said second interlevel dielectric layer, completely filling said second via hole, including deposition on top surface of said thin overlying insulator layer, of said first interlevel dielectric composite layer, in said second via hole, in regions where said second via hole did not overlie said first metal structure, deposition on a portion of the top surface of said first level metal structure, and deposition on the exposed side of said first level metal structure; and patterning of said second metallization layer to form second level metal structure.

2. The method of claim 1, wherein said thick underlying insulator layer, of said first interlevel dielectric composite layer, is silicon oxide, deposited using PECVD processing, at a temperature between about 400° to 600° C., to a thickness between about 3000 to 6000 Angstroms.

3. The method of claim 1, wherein said thin overlying insulator layer, of said first interlevel dielectric composite layer, is silicon nitride, deposited using PECVD processing, at a temperature between about 400° to 600° C., to a thickness between about 500 to 1000 Angstroms.

4. The method of claim 1, wherein said first via hole is formed in said first interlevel dielectric composite layer, via RIE processing, using $Cl_2$ as an etchant for said thin overlying insulator layer, and using $CHF_3$ as an etchant for said thick underlying insulator layer.

5. The method of claim 1, wherein said first metallization layer is deposited using r.f. sputtering, and is comprised of: an underlying layer of titanium nitride, at a thickness between about 200 to 500 Angstroms; a layer of aluminum, containing between about 1 to 3% copper, and between about 0.5 to 1% silicon, at a thickness between about 4000 to 8000 Angstroms; and an overlying layer of titanium nitride, at a thickness between about 200 to 500 Angstroms.

6. The method of claim 1, wherein said first level metallization structure is formed via anisotropic, RIE procedures, using $Cl_2$ as an etchant.

7. The method of claim 1, wherein said second interlevel dielectric layer is silicon oxide, deposited using PECVD processing, at a temperature between about 400° to 600° C., to a thickness between about 3000 to 6000 Angstroms.

8. The method of claim 1, wherein said second via hole is formed in said second interlevel dielectric layer, via use of RIE procedures, using $CHF_3$ as an etchant, and with a etch selectivity between said silicon oxide, and an said underlying silicon nitride layer, of between about 3 to 1.

9. The method of claim 1, wherein said second metallization layer is deposited using r.f. sputtering, and is comprised of: an underlying layer of titanium nitride, at a thickness between about 200 to 500 Angstroms; a layer of aluminum, containing between about 1 to 3% copper, and between about 0.5 to 1% silicon, at a thickness between about 4000 to 8000 Angstroms; and an overlying layer of titanium nitride, at a thickness between about 200 to 500 Angstroms.

* * * * *

UNITED STATES PATENT AND TRADEMARK OFFICE
CERTIFICATE OF CORRECTION

PATENT NO. : 5,840,624
DATED : 11/24/98
INVENTOR(S) : Syun-Ming Jang and Chen-Hua Douglas Yu It is certified that error appears in the above-indentified patent and that said Letters Patent is hereby corrected as shown below:

On the Cover Page, at (75), delete "Yu Chen-Hua Douglas" and replace with --Chen-Hua Douglas Yu--

Signed and Sealed this

Twenty-third Day of March, 1999

Attest:

Q. TODD DICKINSON

*Attesting Officer*  *Acting Commissioner of Patents and Trademarks*